United States Patent
Tian et al.

(10) Patent No.: US 10,002,799 B2
(45) Date of Patent: Jun. 19, 2018

(54) ION IMPLANTATION METHOD AND ION IMPLANTATION APPARATUS PERFORMING THE SAME

(71) Applicant: BOE TECHNOLOGY GROUP CO., LTD., Beijing (CN)

(72) Inventors: Hui Tian, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 14/422,364

(22) PCT Filed: May 7, 2014

(86) PCT No.: PCT/CN2014/076949
§ 371 (c)(1),
(2) Date: Feb. 19, 2015

(87) PCT Pub. No.: WO2015/096348
PCT Pub. Date: Jul. 2, 2015

(65) Prior Publication Data
US 2016/0035634 A1   Feb. 4, 2016

(30) Foreign Application Priority Data
Dec. 23, 2013   (CN) .......................... 2013 1 0717393

(51) Int. Cl.
  H01L 21/66      (2006.01)
  H01J 37/304     (2006.01)
  H01J 37/317     (2006.01)
  H01L 21/265     (2006.01)

(52) U.S. Cl.
  CPC ............ H01L 22/20 (2013.01); H01J 37/304 (2013.01); H01J 37/3171 (2013.01); H01L 21/265 (2013.01); *H01J 2237/04756* (2013.01); *H01J 2237/24542* (2013.01)

(58) Field of Classification Search
  CPC ..................................................... H01L 21/66
  USPC ..................................................... 250/492.3
  See application file for complete search history.

(56) References Cited

U.S. PATENT DOCUMENTS

| | | | |
|---|---|---|---|
| 6,242,749 B1 | 6/2001 | Maishev et al. | |
| 6,946,667 B2 * | 9/2005 | Chen ..................... | H01J 37/244 250/492.21 |
| 7,547,460 B2 * | 6/2009 | Cucchetti ............. | H01J 37/1474 250/396 R |
| 7,624,411 B2 * | 11/2009 | Ellis ................... | H04N 5/44543 386/326 |
| 9,870,896 B2 * | 1/2018 | Tsai .................... | H01J 37/3171 |
| 2008/0073582 A1 | 3/2008 | Shichi et al. | |

FOREIGN PATENT DOCUMENTS

| | | |
|---|---|---|
| CN | 1196573 A | 10/1998 |
| CN | 1577746 A | 2/2005 |
| CN | 1977352 A | 6/2007 |
| CN | 102117869 A | 7/2011 |
| CN | 102479655 A | 5/2012 |
| CN | 102629553 A | 8/2012 |
| CN | 103715073 A | 4/2014 |

OTHER PUBLICATIONS

1st office action issued in Chinese application No. 201310717393.3 dated Oct. 30, 2015.
English translation of Written Opinion of PCT/CN2014/076949 from ISR dated Sep. 23, 2014 that was originally provided to the USPTO on Feb. 19, 2015 with the application.
International Application No. PCT/CN2014/076949, International Search Report dated Sep. 23, 2014, twelve (12) pages.
C. E. Sosolik, A. C. Lavery, E. B. Dahl, and B. H. Cooper, "A technique for accurate measurements of ion beam current density using a Faraday cup", American Institute of Physics, Review of Scientific Instruments, Sep. 2000, vol. 71, Issue 9, pp. 3326-3330.
Xiaowei Zhou, Dequan Xu, Ying Liu, Xiangdong Xu, and Shaojun Fu, "Amending the uniformity of ion beam current density profile", Proceedings of SPIE—The International Society of Optical Engineering, Mar. 2008, vol. 6832, pp. 68322N-1 to 68322N-6.
A. L. Stepanov and V. N. Popok, "Effect of the ion beam current density on the formation of implanted metal nanoparticles in a dielectric matrix", Technical Physics Letters, Dec. 2003, vol. 29, Issue 12, pp. 977-979.

* cited by examiner

*Primary Examiner* — Phillip A Johnston
(74) *Attorney, Agent, or Firm* — Nath, Goldberg & Meyer; Joshua B. Goldberg

(57) ABSTRACT

The present invention provides an improved ion implantation method and an ion implantation apparatus for performing the improved ion implantation method, belongs to the field of ion implantation technology, which can solve the problem of the poor stability and uniformity of the ion beam of the existing ion implantation apparatus. The improved ion implantation method of the invention comprises steps of: S1, detecting densities and beam distribution nonuniformities under various decelerating voltages; S2, determining an operation decelerating voltage based on the beam densities and the beam distribution nonuniformities; and S3, performing an ion implantation under the determined operation decelerating voltage. The present invention ensures the uniformity and stability of the ion beam, and thus ensures the uniformity of performances of the processed base materials in each batch or among various batches.

19 Claims, 2 Drawing Sheets

US 10,002,799 B2

ION IMPLANTATION METHOD AND ION IMPLANTATION APPARATUS PERFORMING THE SAME

This is a National Phase Application filed under 35 U.S.C. 371 as a national stage of PCT/CN2014/076949, filed May 7, 2014, and claims priority benefit from Chinese Application No. 201310717393.3, filed Dec. 23, 2013, the content of each of which is hereby incorporated by reference in its entirety.

FIELD OF THE INVENTION

The invention belongs to the field of ion implantation technology, and particularly, to an improved ion implantation method and an ion implantation apparatus performing the same.

BACKGROUND OF THE INVENTION

Among the semiconductor device manufacturing processes, an ion implantation process is used to perform doping on a display panel, a semiconductor wafer or other work pieces. Doping is often performed on a substrate, and various expected effects on the substrate may be achieved by implanting a certain type of ions therein to change the diffusion capability of a dielectric layer of the substrate.

In a practical application, an ion implantation process is performed in batches, that is, a plurality of substrates are implanted simultaneously or implanted in batches. When a plurality of substrates or a plurality of batches of substrates are processed in this manner, the ion implantation apparatus is required to continuously generate uniform and stable ion beam.

However, when a large batches of substrates are processed by using a conventional ion implantation apparatus, the stability and uniformity of the ion beam are always changed, that is, when different batches of substrates are processed, there are remarkable difference in the stability and uniformity of the ion beam, thus performance uniformity of the processed base materials in each batch or among various batches cannot be ensured. The stability and uniformity of ion implantation have become a problem to be solved urgently in the current semiconductor process. In the prior art, in order to solve the problem in stability of ion implantation, a common method used is to improve the structure of the apparatus, however, this method causes a high cost, and the stability of ion implantation is still low.

SUMMARY OF THE INVENTION

An object of the invention is to solve the problem of the poor stability and uniformity of ion implantation in the prior art, and the present invention provides an improved ion implantation method and an ion implantation apparatus performing the same.

A solution adopted in the invention to solve the problem is an improved ion implantation method comprising steps of:

S1, detecting beam current densities and non-uniformities of beam current density distribution under various decelerating voltages;

S2, determining an operation decelerating voltage based on the beam current densities and the non-uniformities of beam current density distribution; and S3, performing an ion implantation under the determined operation decelerating voltage.

Preferably, the step 1 comprises steps of:

S11, setting initial values of parameters, including: setting an initial value of the decelerating voltage to $V_0$, the beam current density to $\rho_0$, the non-uniformity of beam current density distribution to $x_0$, an optimization range of the decelerating voltage to $V_0 \pm L$, a control error range of the beam current density to p, and the non-uniformity of beam current density distribution to be less than q;

S12, preliminarily determining starting points for optimization of the decelerating voltage, wherein taking m different decelerating voltage test points within the optimization range of the decelerating voltage $V_0 \pm L$, and measuring beam current densities $\rho_g$ and non-uniformities of beam current density distribution $x_g$ under the m test points, respectively.

Preferably, the step S2 comprises steps of:

S21, filtering the starting points for optimization of the decelerating voltage, including:

taking decelerating voltages at n test points, under which the beam current density $\rho_g$ and the non-uniformity of beam current density distribution $x_g$ satisfy $|\rho_g - \rho_0| < p$ and $x_g < q$, as a starting-point set for optimization of the decelerating voltage; ranking the n starting points for optimization of the decelerating voltage according to an order of the non-uniformity of beam current density distribution $x_g$ from the smallest one to the biggest one, and taking them as starting points for optimization of the decelerating voltage sequentially;

S22, evaluating pre-operation decelerating voltages, including:

sequentially evaluating the starting points for optimization of the decelerating voltage, performing an ion implantation process under a decelerating voltage $V_i$ corresponding to the i-th starting point for optimization of the decelerating voltage, obtaining a non-uniformity of beam current density distribution $x_i$ corresponding to the decelerating voltage $V_i$, detecting and recording corresponding non-uniformities of beam current density distribution every a predetermined time interval for k times, and defining the recorded non-uniformities of beam current density distribution as $x_{i r} \in [x_{i1}, x_{i2}, \ldots x_{ik}]$;

S23, determining an operation decelerating voltage, including:

comparing an error ratio value $|x_{i r} - x_i|/x_i$ between $x_{i r}$ and $x_i$ with a control error upper limit W of the non-uniformity of beam current density distribution;

when all $x_{i r}$ satisfy $(|x_{i r} - x_i|/x_i) < W$, determining the decelerating voltage $V_i$ corresponding to the i-th test point as the operation decelerating voltage; and when at least one $x_{i r}$ satisfies $(|x_{i r} - x_i|/x_i) \geq W$, performing the step S22 for the decelerating voltage $V_{i+1}$.

Preferably, p is 5%, and q is 10%.

Preferably, m is a natural number equal to or more than 10.

Preferably, $L = V_0/5$.

Preferably, the m test points are uniformly distributed within the optimization range of the decelerating voltage $V_0 \pm L$.

Preferably, W is 3%.

Preferably, k is a natural number equal to or more than 10.

Preferably, the step S3 comprises performing the ion implantation process on at least one base material under the determined decelerating voltage.

Furthermore, the invention further provides an ion implantation apparatus for performing the above improved ion implantation method.

In the improved ion implantation method and the ion implantation apparatus performing the improved ion implantation method in the invention, through adjusting the decelerating voltage of the decelerating electrode of the ion implantation apparatus, an operation decelerating voltage of the decelerating electrode is determined so that the beam current density and the non-uniformity of beam current density distribution are within a predetermined control range, thus the uniformity of performances of the base materials in the same batch and among batches is ensured.

DETAILED DESCRIPTION OF EMBODIMENTS

In order to make persons skilled in the art better understand the solutions of the present invention, the present invention will be further described in detail below in conjunction with the drawings and embodiments.

The present invention provides an improved ion implantation method, which may be used in any type of ion implantation, so that the beam current density and the non-uniformity of beam current density distribution are within a predetermined control range, so as to ensure the uniformity of performances of the substrates subjected to the ion implantation in the same batch or among various batches.

Embodiment 1

Figure 1:
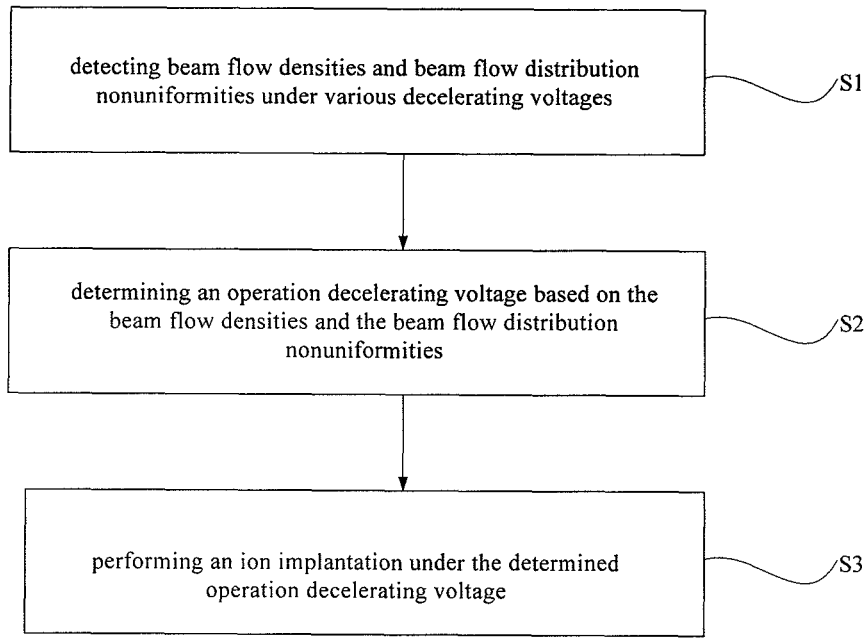
FIG. 1 is a flowchart of an ion beam control method of an ion implantation apparatus in the embodiment 1 of the present invention.

As shown in FIG. 1, the invention provides an improved ion implantation method comprising steps of:
step S1, detecting beam current densities and non-uniformities of beam current density distribution under various decelerating voltages;
step S2, determining an operation decelerating voltage based on the beam current densities and the non-uniformities of beam current density distribution; and
step S3, performing an ion implantation under the determined operation decelerating voltage.

Figure 2:
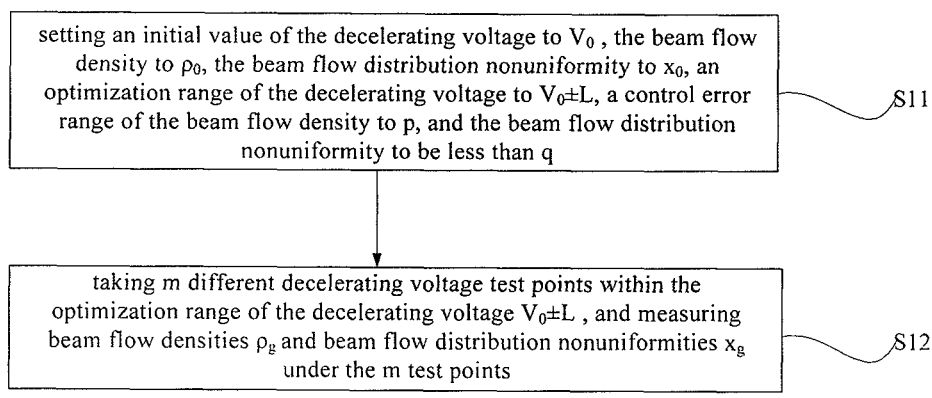
FIG. 2 is a flowchart illustrating how to detect the beam current densities and the non-uniformities of beam current density distribution under various decelerating voltages in the embodiment 1 of the present invention.

Specifically, as shown in FIG. 2, the step S1 comprises following steps.

Step S11, setting initial values of parameters.

Specifically, the control parameters of an ion implantation process are set as follows: setting an initial value of the decelerating voltage to $V_0$, the beam current density to $\rho_0$, the non-uniformity of beam current density distribution to $x_0$, an optimization range of the decelerating voltage to $V_0 \pm L$, a control error range of the beam current density to p, and the non-uniformity of beam current density distribution to be less than q.

Preferably, the initial value of the decelerating voltage $V_0$ is a decelerating voltage when the former process is stable; the beam current density $\rho_0$ and the non-uniformity of beam current density distribution $x_0$ are the beam current density and the non-uniformity of beam current density distribution corresponding to the decelerating voltage when the former process is stable. When an operator thinks that the ion implantation process is unstable, he/her may adjust the decelerating voltage near its initial value $V_0$ to ensure the stability of the ion implantation process among batches.

Process control parameters q, p and L of the ion implantation apparatus are set experientially depending on the performance of the ion implantation apparatus and requirements on processing of the base material. Preferably, the non-uniformity of beam current density distribution is less than 10%, namely, q is 10%; the control error range of the beam current density p is 5%. Preferably, the optimization range of the decelerating voltage $V_0 \pm L$ is $V_0 \pm V_0/5$.

Step S12, preliminarily determining starting points for optimization of the decelerating voltage,
wherein taking m different decelerating voltage test points within the optimization range of the decelerating voltage $V_0 \pm L$, and measuring beam current densities $\rho_g$ and non-uniformities of beam current density distribution $x_g$ under the m test points, respectively.

Preferably, m is a natural number equal to or more than 10, and the more the test points are selected, the more accurate the decelerating voltage obtained by optimization is.

Preferably, the m test points are uniformly distributed within the optimization range of the decelerating voltage $V_0 \pm L$, so that the preferable operation decelerating voltage is not easily be omitted.

It should be understood that, a method for detecting the beam current density and the non-uniformity of beam current density distribution under a specific decelerating voltage is described above, however, other similar methods in the prior art are applicable.

Figure 3:
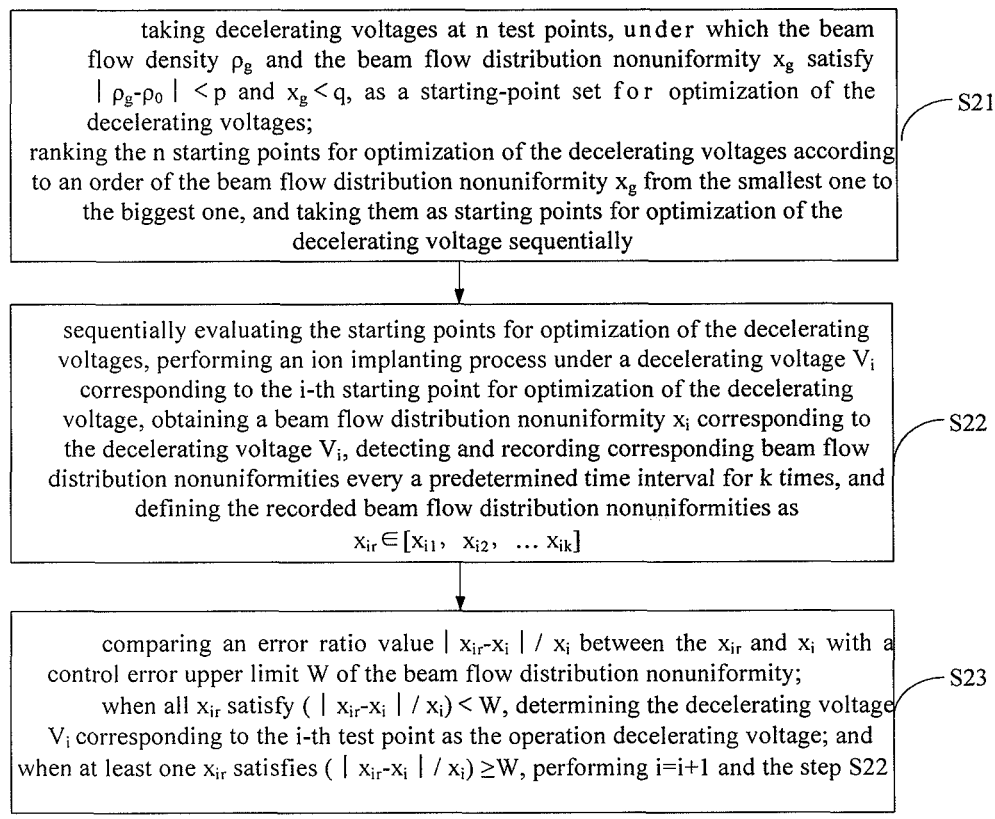
FIG. 3 is a flowchart illustrating how to determine the operation decelerating voltage based on the beam current densities and the non-uniformities of beam current density distribution in the embodiment 1 of the present invention.

As shown in FIG. 3, the step S2 comprises following steps.

Step S21, filtering the starting points for optimization of the decelerating voltage.

Decelerating voltages at n test points, under which the beam current density $\rho_g$ and the non-uniformity of beam current density distribution $x_g$ satisfy $|\rho_g - \rho_0| < p$ and $x_g < q$, are taken as a starting-point set for optimization of the decelerating voltage; that is, the above m test points are filtered to find out n test points as the starting point set for optimization of the decelerating voltage.

Next, the filtered n starting points for optimization of the decelerating voltage are ranked according to an order of the non-uniformities of beam current density distribution $x_g$ from the smallest one to the biggest one, used as starting points for optimization of the decelerating voltage sequentially, and respectively recorded as $(x_{g1}, x_{g2}, \ldots, x_{gi}, \ldots, x_{gn})$. For a test point, the smaller the non-uniformity of beam current density distribution is, the better the quality of the ion beam thereof is, therefore, in a case that the beam current density is within a certain error range of a set target beam current density, a decelerating voltage corresponding to the test point with small non-uniformity of beam current density distribution is first selected to evaluate, wherein $1 \leq i \leq n$.

Step S22, evaluating pre-operation decelerating voltages.

The starting points for optimization of the decelerating voltage are taken as pre-operation decelerating voltages, and the size of a fluctuation range of the non-uniformities of beam current density distribution corresponding to each pre-operation decelerating voltage at different time points is taken as a criterion for evaluating the pre-operation decelerating voltage to determine whether the pre-operation decelerating voltage is an operation decelerating voltage.

Specifically, the pre-operation decelerating voltages are sequentially evaluated according to the order of the starting points for optimization of the decelerating voltage. First, the pre-operation decelerating voltage $V_1$ determined in the step S21 corresponding to the smallest non-uniformity of beam current density distribution $x_{g1}$ is evaluated. For example, the evaluating procedure of every pre-operation decelerating voltage $V_i$ is as follows: performing an ion implantation process under the decelerating voltage $V_i$ corresponding to the i-th starting point for optimization of the decelerating voltage, obtaining a non-uniformity of beam current density distribution $x_i$ corresponding to the decelerating voltage $V_i$ in the step S12, detecting and recording corresponding non-uniformities of beam current density distribution every a time period of $\Delta t$ for k times, and defining the recorded non-uniformities of beam current density distribution as $x_{ir} \in [x_{i1}, x_{i2}, \ldots x_{1k}]$;

Preferably, k is a natural number equal to or more than 10, and the more the test points are, the more adequate the data for optimization of the decelerating voltage is.

It should be understood that, the above parameters may be adjusted depending on experience and application scene, for example, the length of the time period of $\Delta t$ and the number k of the time periods may be combinedly adjusted.

Step S23, determining an operation decelerating voltage.

comparing an error ratio value $|x_{ir}-x_i|/x_i$ between the $x_{ir}$ and $x_i$ with a control error upper limit W of the non-uniformity of beam current density distribution;

wherein, preferably, W is 3%, which requires that the fluctuation range of corresponding non-uniformities of beam current density distribution of the pre-operation decelerating voltage at various time points is small, and of course, W may be adjusted according to a specific application scene.

Specifically, when all $x_{ir}$ satisfy $(|x_{ir}-x_i|/x_i)<W$, the decelerating voltage $V_i$ corresponding to the i-th test point is determined as the operation decelerating voltage, the step S23 of determining the operation decelerating voltage is completed, and then the step S3 is performed, that is, the ion implantation process is performed under the operation decelerating voltage.

When at least one $x_{ir}$ satisfies $(|x_{ir}-x_i|/x_1) \geq W$, i=i+1 is performed, and the step S22 is performed, namely, the next start point for optimization of the decelerating voltage $V_{i+1}$ (that is, next per-operation decelerating voltage $V_{i+1}$) is evaluated, and whether the per-operation decelerating voltage is the operation decelerating voltage is determined by the step S23, if yes, the step S23 of determining the operation decelerating voltage is completed and then the step S3 is performed, namely, the ion implantation process is performed under the operation decelerating voltage $V_{i+1}$; and if no, the step S22 is performed, that is, the pre-operation decelerating voltage $V_{i+2}$ is evaluated, and whether the per-operation decelerating voltage is the operation decelerating voltage is determined by the step S23 to determine the operation decelerating voltage. In the present embodiment, the above operations are performed repeatedly till an operation decelerating voltage is determined.

In summary, the operation decelerating voltage obtained in embodiments of the invention is acquired by sequentially evaluating the pre-operation decelerating voltages with respect to the selected starting points for optimization of the decelerating voltage in the order of the non-uniformities of beam current density distribution from the smallest one to the biggest one, that is to say, if the pre-operation decelerating voltage $V_1$ corresponding to the smallest non-uniformity of beam current density distribution $x_{g1}$ in the step S21 is determined as the operation decelerating voltage by the step S22 and the step S23, then the step S3 may be performed, namely, the ion implantation process is performed under the operation decelerating voltage $V_1$. If the pre-operation decelerating voltage $V_1$ corresponding to the smallest non-uniformity of beam current density distribution $x_{g1}$ in the step S21 is not determined as the operation decelerating voltage by the step S22 and the step S23, then the pre-operation decelerating voltage $V_2$ corresponding to the second smallest non-uniformity of beam current density distribution $x_{g2}$ is evaluated, and so on, till an operation decelerating voltage is determined.

After the operation decelerating voltage is determined by the steps S21, S22 and S23 in FIG. 3, the ion implantation process is performed on at least one base material under the determined operation decelerating voltage, preferably, the number of the base materials is 10, and of course, the number of the base materials may be increased or reduced as desired.

The ion implantation apparatus performs ion implantation process on the base material under the operation decelerating voltage determined according to the embodiment of the invention, the uniformity and stability of the ion beam is ensured, and thus uniformity of performances of the processed base materials in each batch or among various batches may be ensured, therefore, uniformity of performances of semiconductor devices made of the base materials may be ensured.

It should be understood that, the above embodiments are only exemplary embodiments employed to illustrate the principle of the invention, and the invention is not limited thereto. Persons skilled in the art can make various modifications and improvements without departing from the principle and substance of the invention, and these modifications and improvements should be considered to be within the protection scope of the invention.

The invention claimed is:

1. An ion implantation method comprising steps of:
    S1, detecting beam current densities and non-uniformities of beam current density distribution under various decelerating voltages;
    S2, determining an operation decelerating voltage based on the beam current densities and the non-uniformities of beam current density distribution; and
    S3, performing an ion implantation under the determined operation decelerating voltage,
    wherein S1 comprises steps of:
    S11, setting initial values of parameters, including:
    setting an initial value of the decelerating voltage to $V_0$, the beam current density to $\rho_0$, the non-uniformity of beam current density distribution to $x_0$, an optimization range of the decelerating voltage to $V_0 \pm L$, a control error range of the beam current density to p, and the non-uniformity of beam current density distribution to be less than q, and
    S12, preliminarily determining starting points for optimization of the decelerating voltage,
    wherein m different decelerating voltage test points are taken within the optimization range of the decelerating voltage $V_0 \pm L$, and beam current densities $\rho_g$ and non-uniformities of beam current density distribution $x_g$ under the m test points are measured, respectively.

2. The ion implantation method of claim 1, wherein S2 comprises steps of:
    S21, filtering the starting points for optimization of the decelerating voltage, including:
    taking decelerating voltages at n test points, under which the beam current density $\rho_g$ and the non-uniformity of beam current density distribution $x_g$ satisfy $|\rho_g-\rho_0|<p$ and $x_g<q$, as a starting-point set for optimization of the decelerating voltage; and ranking the n starting points for optimization of the decelerating voltage according to an order of the non-uniformities of beam current density distribution $x_g$ from the smallest one to the biggest one, and taking them as starting points for optimization of the decelerating voltage sequentially;

S22, evaluating pre-operation decelerating voltages, sequentially evaluating the starting points for optimization of the decelerating voltage, performing an ion implantation process under a decelerating voltage $V_i$ corresponding to the i-th starting point for optimization of the decelerating voltage, obtaining a non-uniformity of beam current density distribution $x_i$ corresponding to the decelerating voltage $V_i$, detecting and recording corresponding non-uniformities of beam current density distribution every a predetermined time interval for k times, and defining the recorded non-uniformities of beam current density distribution as $x_{ir} \in [x_{i1}, x_{i2}, \ldots x_{ik}]$;

S23, determining an operation decelerating voltage, including:

comparing an error ratio value $|x_{ir}-x_i|/x_i$ between $x_{ir}$ and $x_i$ with a control error upper limit W of the non-uniformity of beam current density distribution;

when all $x_{ir}$ satisfy $(|x_{ir}-x_i|/x_i)<W$, determining the decelerating voltage $V_i$ corresponding to the i-th test point as the operation decelerating voltage; and when at least one $x_{ir}$ satisfies $(|x_{ir}-x_i|/x_i) \geq W$, performing S22 for the decelerating voltage $V_{i+1}$.

3. The ion implantation method of claim 1, wherein p is 5%, and q is 10%.

4. The ion implantation method of claim 2, wherein p is 5%, and q is 10%.

5. The ion implantation method of claim 1, wherein m is a natural number equal to or more than 10.

6. The ion implantation method of claim 2, wherein m is a natural number equal to or more than 10.

7. The ion implantation method of claim 3, wherein m is a natural number equal to or more than 10.

8. The ion implantation method of claim 4, wherein m is a natural number equal to or more than 10.

9. The ion implantation method of claim 1, wherein $L=V_0/5$.

10. The ion implantation method of claim 2, wherein $L=V_0/5$.

11. The ion implantation method of claim 3, wherein $L=V_0/5$.

12. The ion implantation method of claim 4, wherein $L=V_0/5$.

13. The ion implantation method of claim 1, wherein them test points are uniformly distributed within the optimization range of the decelerating voltage $V_0 \pm L$.

14. The ion implantation method of claim 2, wherein the m test points are uniformly distributed within the optimization range of the decelerating voltage $V_0 \pm L$.

15. The ion implantation method of claim 3, wherein the m test points are uniformly distributed within the optimization range of the decelerating voltage $V_0 \pm L$.

16. The ion implantation method of claim 2, wherein W is 3%.

17. The ion implantation method of claim 2, wherein k is a natural number equal to or more than 10.

18. The ion implantation method of claim 1, wherein S3 comprises a step of performing the ion implantation process on at least one base material under the determined operation decelerating voltage.

19. An ion implantation apparatus for performing the ion implantation method of claim 1.

* * * * *